United States Patent [19]
Uehara et al.

[11] Patent Number: 5,514,991
[45] Date of Patent: May 7, 1996

[54] SYNCHRONOUS DATA ROW GENERATING CIRCUIT

[75] Inventors: Takafumi Uehara; Haruhiko Fujii, both of Tokyo, Japan

[73] Assignee: Ando Electric Co., Ltd., Tokyo, Japan

[21] Appl. No.: 426,466

[22] Filed: Apr. 19, 1995

[30] Foreign Application Priority Data

Apr. 28, 1994 [JP] Japan ................................. 6-114101

[51] Int. Cl.⁶ .............................. H03L 7/00; H03K 3/017
[52] U.S. Cl. ........................ 327/154; 327/160; 327/176; 327/291
[58] Field of Search .................................. 327/154, 160, 327/176, 291

[56] References Cited

U.S. PATENT DOCUMENTS 5,087,835  2/1992  Hattangadi ............................. 327/291
5,418,822  5/1995  Schlachter et al. ..................... 327/291
5,457,323  9/1995  Rosen ................................... 327/291

*Primary Examiner*—Margaret Rose Wambach
*Attorney, Agent, or Firm*—Flynn, Thiel, Boutell & Tanis

[57] ABSTRACT

A rate generating portion generates a second rate signal comprising a desired first rate signal having arbitrary time intervals preceded by a preceding rate signal composed of (N+1) pulses, a data row generating portion composed of N logic circuits and N D-type flip-flops generates an arbitrary data row with the second rate signal as a synchronizing clock, a preceding rate masking circuit masks the preceding rate signal in the second rate signal to output the first rate signal and a D-type flip-flop receives the output of the data row generating portion at the data input terminal thereof and the output of the preceding rate masking circuit at the clock input terminal thereof to generate a data row in synchronism with the first rate signal. As a result, it is possible to provide a synchronous data row generating circuit which operates stably without using the conventional delay elements for adjustment since the data row generating portion therein is composed of synchronous circuits.

2 Claims, 6 Drawing Sheets

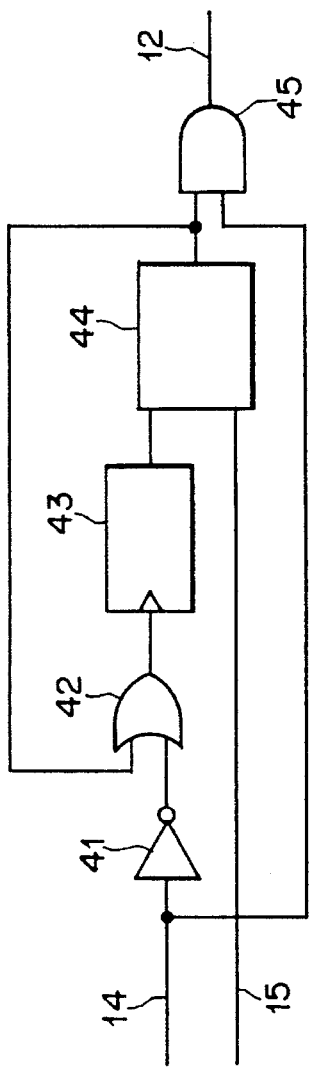
FIG. 6
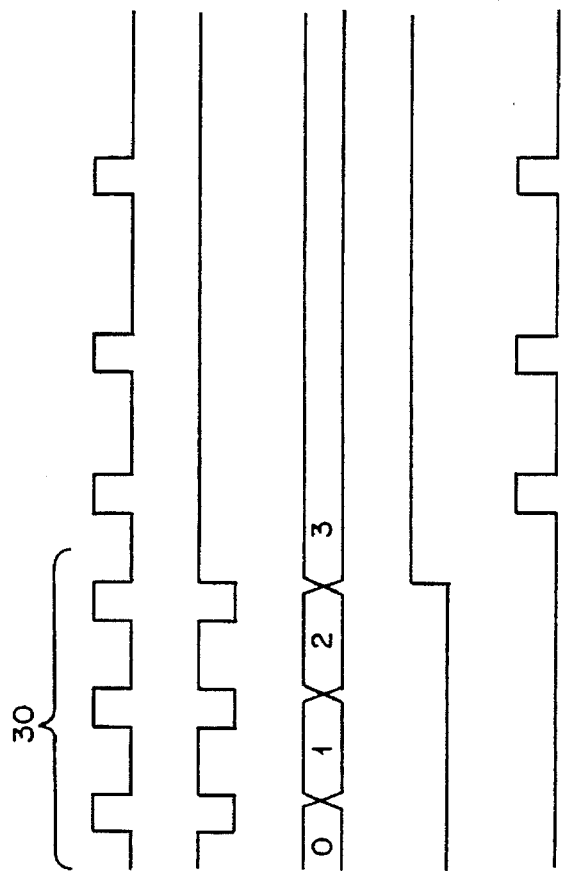
FIG. 7(a)
FIG. 7(b)
FIG. 7(c)
FIG. 7(d)
FIG. 7(e)

SYNCHRONOUS DATA ROW GENERATING CIRCUIT

BACKGROUND OF THE INVENTION

1. Field of the Invention

The present invention relates to a circuit for generating a data row in synchronism with a rate signal having arbitrary time intervals, the circuit being for use in an IC tester etc.

2. Description of the Related Art

FIG. 4 shows an arrangement of a synchronous data row generating circuit of prior art. In FIG. 4, denoted at 10 is a rate generating portion, 20 is a data row generating portion, $20_1$ to $20_N$ are logic circuits, $21_1$ to $21_N$ are D-type flip-flops (referred to as D-type FFs hereinafter), circuits, $22_1$ to $22_N$ are delay elements and $23_1$ to $23_N$ are gates. The logic circuits $20_1$ to $20_N$, the D-type FFs $21_1$ to $21_N$, the delay elements $22_1$ to $22_N$ and the gates $23_1$ to $23_N$ constitute the data row generating portion 20.

In FIG. 4, the output of the rate generating portion 10 is connected to the logic circuit $20_1$ and delay element $22_1$ of the data row generating portion 20. The output of the delay element $22_1$ is connected to the gate $23_1$. The output of the gate $23_1$ is connected to the clock input terminal of the D-type FF $21_1$ and the delay element $22_2$. Following logic circuits, delay elements, D-type FFs and gates are similarly connected to one another in series.

The timing chart of the synchronous data row generating circuit in FIG. 4 is shown in FIG. 5. FIG. 5 (a) is the waveform diagram of output of the rate generating portion 10, FIG. 5 (b) is that of output of the logic circuit $20_1$, FIG. 5 (c) is that of output of the gate $23_1$, FIG. 5 (d) is that of output of the D-type FF $21_1$, FIG. 5 (e) is that of output of the gate $23_2$, FIG. 5 (f) is that of output of the D-type FF $21_2$, FIG. 5 (g) is that of output of a rate signal 12 and FIG. 5 (h) is that of a data row 11 generated by the data row generating portion 20.

In FIG. 5, the rate generating portion 10 generates a desired rate signal having arbitrary time intervals as illustrated in FIG. 5 (a). FIG. 5 (a) exemplifies a case of generating a rate signal having time intervals 40 ns, 50 ns, 60 ns, 40 ns, 50 ns, . . . The output of the rate generating portion 10 is transmitted to the logic circuit $20_1$ and the delay element $22_1$.

The logic circuit $20_1$ generates an arbitrary data row as illustrated in FIG. 5 (b) and supplies the same to the data input terminal of the D-type FF $21_1$. The output of the rate generating portion 10 is delayed by the delay element $22_1$ to guarantee a setup time and a hold time in the D-type FF $21_1$ and is further buffered by the gate $23_1$ to be supplied to the clock input terminal of the D-type FF $21_1$. The D-type FF $21_1$ latches the data row in FIG. 5 (b) in the timing of the delayed rate signal illustrated in FIG. 5 (c) to output a data row illustrated in FIG. 5 (d).

Thereafter the output of the D-type FF $21_1$ is processed by the logic circuit $20_2$ to be supplied to the data input terminal of the D-type FF $21_2$. The D-type FF $21_2$ latches the output of the logic circuit $20_2$ in the timing of a rate signal which has been delayed by the delay element $22_2$ and further buffered by the gate $23_1$, as illustrated in FIG. 5 (e) to output a data row as illustrated in FIG. 5 (f).

In a like manner, a data row is generated as illustrated in FIG. 5 (h) in synchronism with a rate signal as illustrated in FIG. 5 (g) while synchronizing the data row with the rate signal by way of the logic circuits, delay elements, gates, and D-type FFs which are connected to one another in series.

In a synchronous data row generating circuit having an arrangement illustrated in FIG. 4, the data row is generated by delaying the rate signal through the delay elements in accordance with the delay time of the logic circuit which generates the data row so as to synchronize the rate signal with the data row having arbitrary time intervals, so that it is necessary to adjust a plurality of delay elements taking into consideration the variation of elements or that of the D-type FFs in setup time or hold time.

SUMMARY OF THE INVENTION

It is an object of the present invention to provide a synchronous data row generating circuit which operates stably by composing the data row generating portion of synchronous circuits without using the conventional delay elements for adjustment.

To achieve the object, the synchronous data row generating circuit of the invention comprises a rate generating portion I which generates a rate signal 14 comprising a desired rate signal 12 having arbitrary time intervals preceded by a preceding rate signal 30 composed of (N+1) pulses, a data row generating portion 2 composed of N logic circuits $20_1$ to $20_N$ and N D-type FFs $21_1$ to $21_N$ for generating an arbitrary data row 13 with the rate signal 14 as a synchronizing clock, a preceding rate masking circuit 3 which masks the preceding rate signal 30 in the rate signal 14 to output the rate signal 12 and a D-type FF 4 which receives the output 13 of the data row generating portion 2 at the data input terminal thereof and the output 12 of the preceding rate masking circuit 3 at the clock input terminal thereof so as to generate a data row 11 in synchronism with the rate signal 12.

BRIEF DESCRIPTION OF THE DRAWINGS

FIG. 6 is a block diagram of a preceding rate masking circuit 3 according to an embodiment of the present invention; and FIGS. 7(a) to (e) are waveform diagrams for explaining the operation of the preceding rate masking circuit 3 in FIG. 6.

DESCRIPTION OF THE PREFERRED EMBODIMENT

Figure 1:
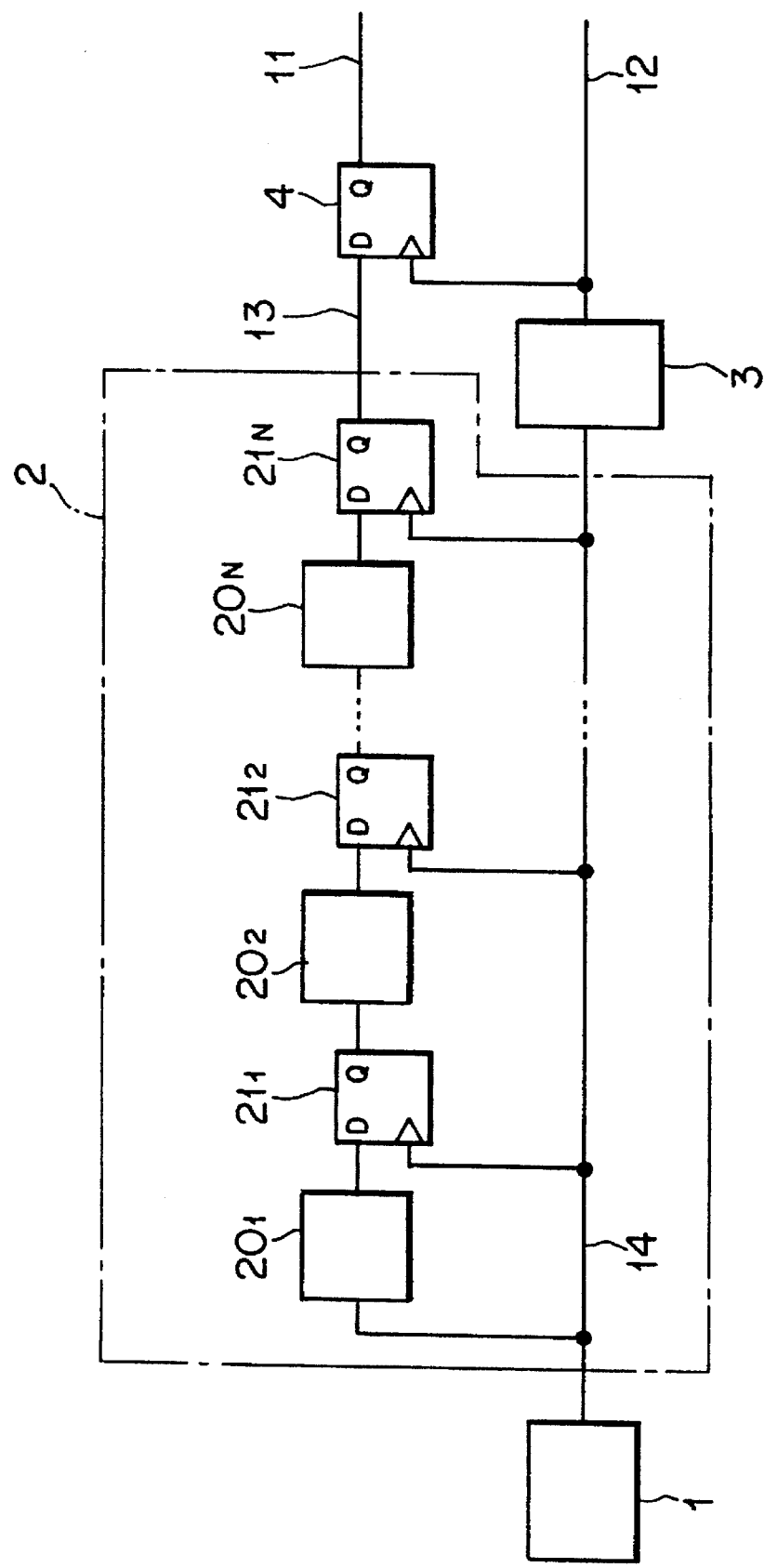
FIG. 1 is a block diagram of a synchronous data row generating circuit according to an embodiment of the present invention.

FIG. 1 shows an arrangement of a synchronous data row generating circuit according to an embodiment of the invention. In FIG. 1, denoted at 1 is a rate generating portion, 2 is a data row generating portion, 3 is a preceding rate masking circuit, 4 is a D-type FF, $20_1$ to $20_N$ are logic circuits and $21_1$ to $21_N$ are D-type FFs. In FIG. 1, the rate generating portion 1 is set to generate a preceding rate signal 30 component (FIG. 2) composed of (N+1) pulses and thereafter the desired signal 12 component having arbitrary time intervals so as to generate the rate signal 14 and output the same to the logic circuit $20_1$, the preceding rate masking circuit 3 and the D-type FFs $21_1$ to $21_N$.

When the rate signal 14 is inputted to the logic circuit $20_1$ in the data row generating portion 2, the logic circuit $20_1$ generates a data row and transmits the same to the D-type FF $21_1$. The D-type FF $21_1$ latches the output of the logic circuit $20_1$ with the rate signal 14 to supply the data row to the logic circuit $20_2$. As a result, the output of the D-type FF $21_1$ is shifted by a clock relative to the rate signal 14 supplied to the logic circuit $20_2$. Similarly, the desired data row 13 shifted by N clocks relative to the rate signal 14 is generated in the logic circuits $20_2$ to $20_N$ and D-type FFs $21_2$ to $21_N$ which are connected to one another in series.

The preceding rate masking circuit 3 masks the preceding rate signal 30 component of the rate signal 14 to output the rate signal 12. The D-type FF 4 latches the data row 13 with the signal 12 to output the data row 11 in synchronization with the rate signal 12.

FIG. 6 shows an arrangement of the preceding rate masking circuit 3 according to the embodiment. In FIG. 6, denoted at 12 is a desired rate signal, 14 is a rate signal generated by the rate generating portion 1, 15 is a mask setting value, 41 is an inverter, 42 is an OR gate, 43 is a counter, 44 is a coincidence circuit and 45 is an AND gate. That is, the preceding rate masking circuit 3 in FIG. 1 is equipped with the inverter 41, the OR gate 42, the counter 43, the comparator 44 and the AND gate 45.

In FIG. 6, the rate signal 14 is inputted to the inverter 41. The output of the OR gate 42 which receives the output of the inverter 41 as a first input is inputted to the counter 43. The comparator circuit 44 which receives the output of the counter 43 as a first input and a mask setting value 15 which has been externally set in advance as a second input supplies its output to the second input terminal of the OR gate 42 and to the first input terminal of the AND gate 45. The AND gate 45 which receives the rate signal 14 as a second input outputs the rate signal 12.

The operation of the synchronous data row generating circuit in FIG. 6 will be described with reference to a timing chart in FIG. 7. FIG. 7 (a) is the waveform diagram of the rate signal 14, FIG. 7 (b) is that of output of the OR gate 42, FIG. 7 (c) is that of output of the counter 43, FIG. 7 (d) is that of output of the comparator 44 and FIG. 7 (e) is that of the rate signal 12. In FIG. 7, the mask setting value 15 is set to "3" as an example for explaining the operation of the preceding rate masking circuit 3.

The rate signal 14 in FIG. 7 (a) is inputted to the inverter 41 and passes through the OR gate 42 to be inputted to the clock input terminal of the counter 43 in a waveform as illustrated in FIG. 7 (b). The counter 43 counts up the pulses and supplies the same in a waveform illustrated in FIG. 7 (c) to the coincidence circuit 44. The coincidence circuit 44 compares the output of the counter with the mask setting value 15. When the output of the counter 43 reaches "3" to conform to the value "3" of the mask setting value 15, the comparator 44 outputs "H" as illustrated in FIG. 7 (d).

When the output of the comparator 44 is supplied to the OR gate 42 and the AND gate 45, the output of the OR gate 42 becomes "H" as illustrated in FIG. 7 (b) to stop the counter 43. As a result, the output of the coincidence circuit 44 keeps "H" as illustrated in FIG. 7 (d). The AND gate 45 outputs the rate signal 12 masking the preceding rate signal 30 as illustrated in FIG. 7 (e).

Figure 2:
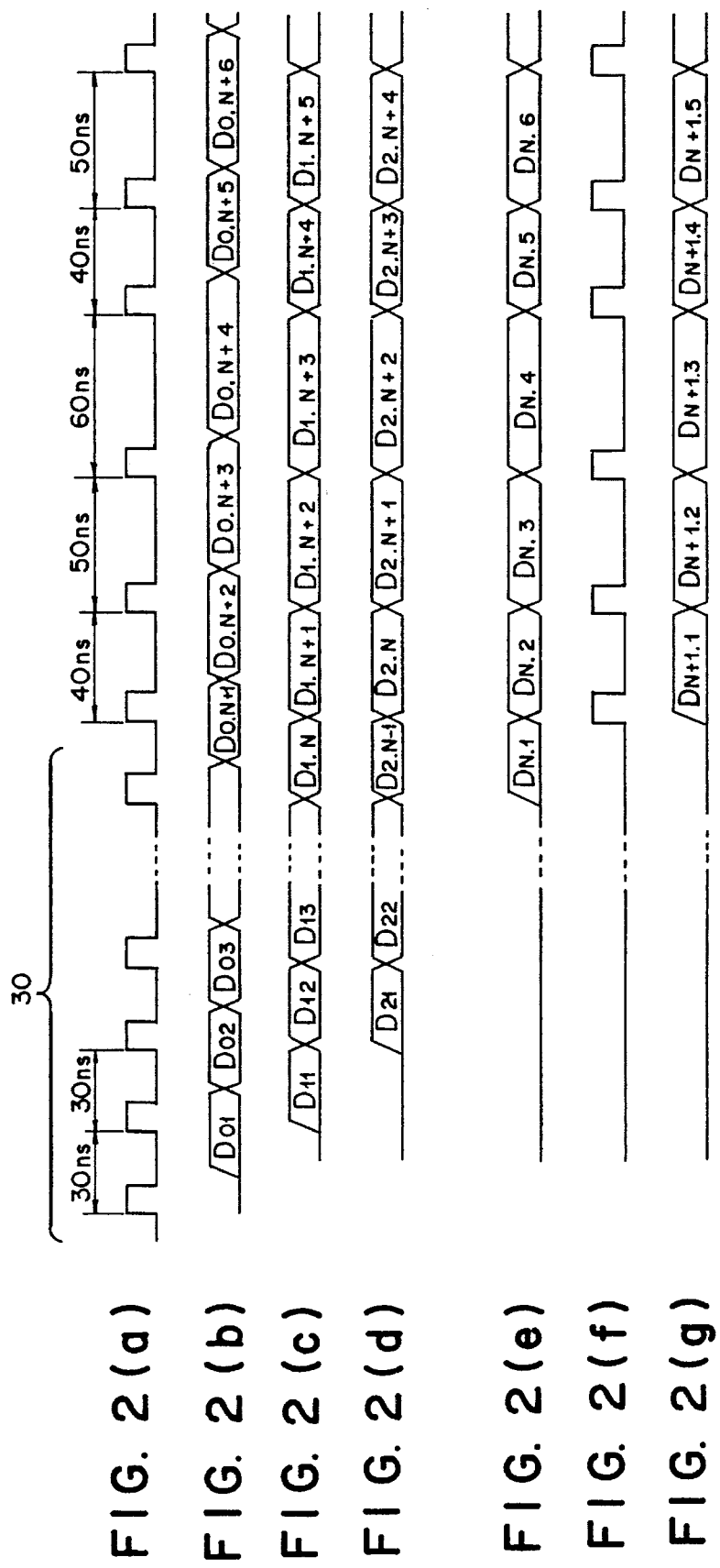
FIGS. 2(a) to 2(g) are waveform diagrams for explaining the embodiment in FIG. 1.

FIG. 2 shows the timing chart of the synchronous data row generating circuit according to the invention and the operation thereof will be described with reference to FIG. 1. FIG. 2 (a) is a waveform diagram of output of the rate generating portion 1, FIG. 2 (b) is that of output of the logic circuit $20_1$, FIG. 2 (c) is that of output of the D-type FF $21_1$, FIG. 2 (d) is that of output of the D-type FF $21_2$, FIG. 2 (e) is that of the data row 13, FIG. 2 (f) is that of the rate signal 12 and FIG. 2 (g) is that of the data row 11. In FIG. 2 (a), denoted at 30 is the preceding rate signal.

The rate generating portion 1 generates the preceding rate signal 30 composed of (N+1) pulses prior to the generation of a desired rate signal 12 having arbitrary time intervals to form the rate signal 14. FIG. 2 (a) exemplifies a case of generating the rate signal 14 wherein the preceding rate signal has 30 ns time intervals while the rate signal 14 has 30 ns, 30 ns, 30 ns, . . . , 40 ns, 50 ns, 60 ns, 40 ns, 50 ns, . . . time intervals.

The rate signal 14 is supplied to the logic circuit $20_1$, the clock input terminals of the D-type FFs $21_1$ to $21_N$ and the preceding rate masking circuit 3. The logic circuit $20_1$ successively generates an arbitrary data row of $D_{01}$, $D_{02}$, $D_{03}$, . . . , $D_{0. N+1}$, $D_{0. N+2}$, $D_{0. N+3}$, $D_{0. N+4}$, $D_{0. N+5}$, $D_{0. N+6}$, . . . to supply the same to the data input terminal of the D-type FF $21_1$ as illustrated in FIG. 2 (b). The D-type FF $21_1$ latches the data row in FIG. 2 (b) with the rate signal 14 to supply an arbitrary data row of $D_{11}$, $D_{12}$, $D_{13}$, . . . . . . , $D_{1. N+1}$, $D_{1. N+2}$, $D_{1. N+3}$, $D_{1. N+4}$, $D_{1. N+5}$, $D_{1. N+6}$, . . . . . . to the logic circuit $20_2$ as illustrated in FIG. 2 (c).

The logic circuit $20_2$ receives the data row illustrated in FIG. 2 (c) and supplies the same to the data input terminal of the D-type FF $21_2$. The D-type FF $21_2$ latches the same with the rate signal 14 to supply an arbitrary data row of $D_{21}$, $D_{22}$, $D_{23}$, . . . . . . , $D_{2. N+1}$, $D_{2. N+2}$, $D_{2. N+3}$, $D_{2. N+4}$, $D_{2. N+5}$, $D_{2. N+6}$, . . . . . . to next logic circuit as illustrated in FIG. 2 (d).

Similarly, an arbitrary number of logic circuits and D-type FFs which are connected to one another after the D-type FF $21_2$ generate a desired data row of $D_{N. 1}$, $D_{N. 2}$, $D_{N. 3}$, $D_{N. 4}$, $D_{N. 5}$, $D_{N. 6}$, . . . . . . as illustrated in FIG. 2 (e).

In FIG. 2 (f), the preceding rate masking circuit 3 masks the preceding rate signal 30 component of the rate signal 14 to output only the rate signal 12 component having time intervals of 40 ns, 50 ns, 60 ns, 40 ns, 50 ns, . . .

The D-type FF 4 latches the data row in FIG. 2 (e) with the rate signal 12 component to output the data row 11 of $D_{N+1. 1}$, $D_{N+1. 2}$, $D_{N+1. 3}$, $D_{N+1. 4}$, $D_{N+1. 5}$, . . . . . . in synchronism therewith as illustrated in FIG. 2 (g).

Figure 3:
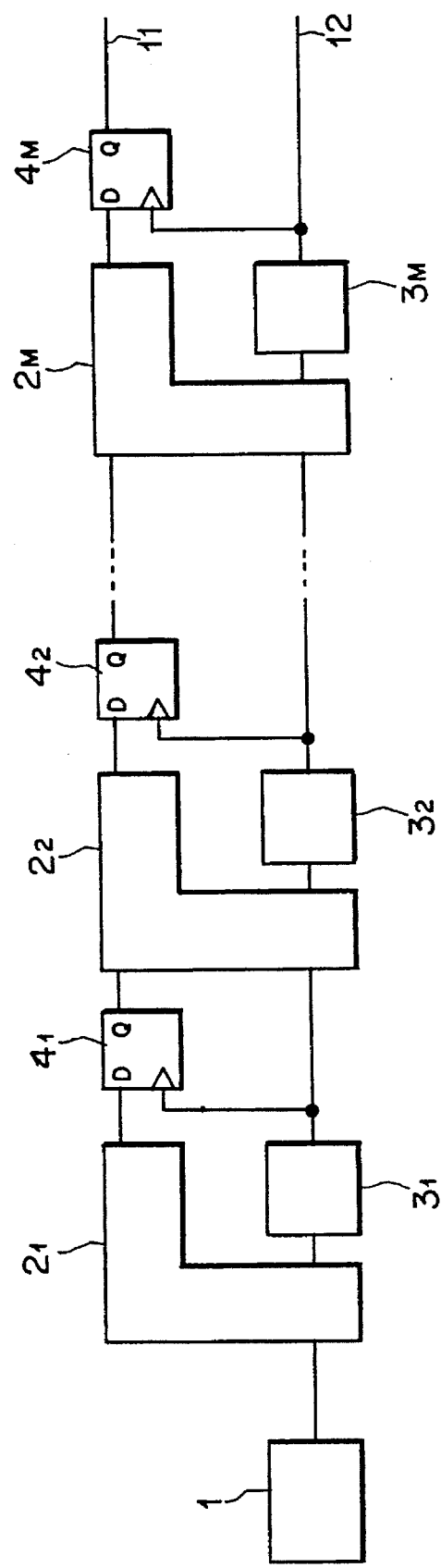
FIG. 3 is a block diagram of a synchronous data row generating circuit according to a modified embodiment of the present invention.
Figure 4:
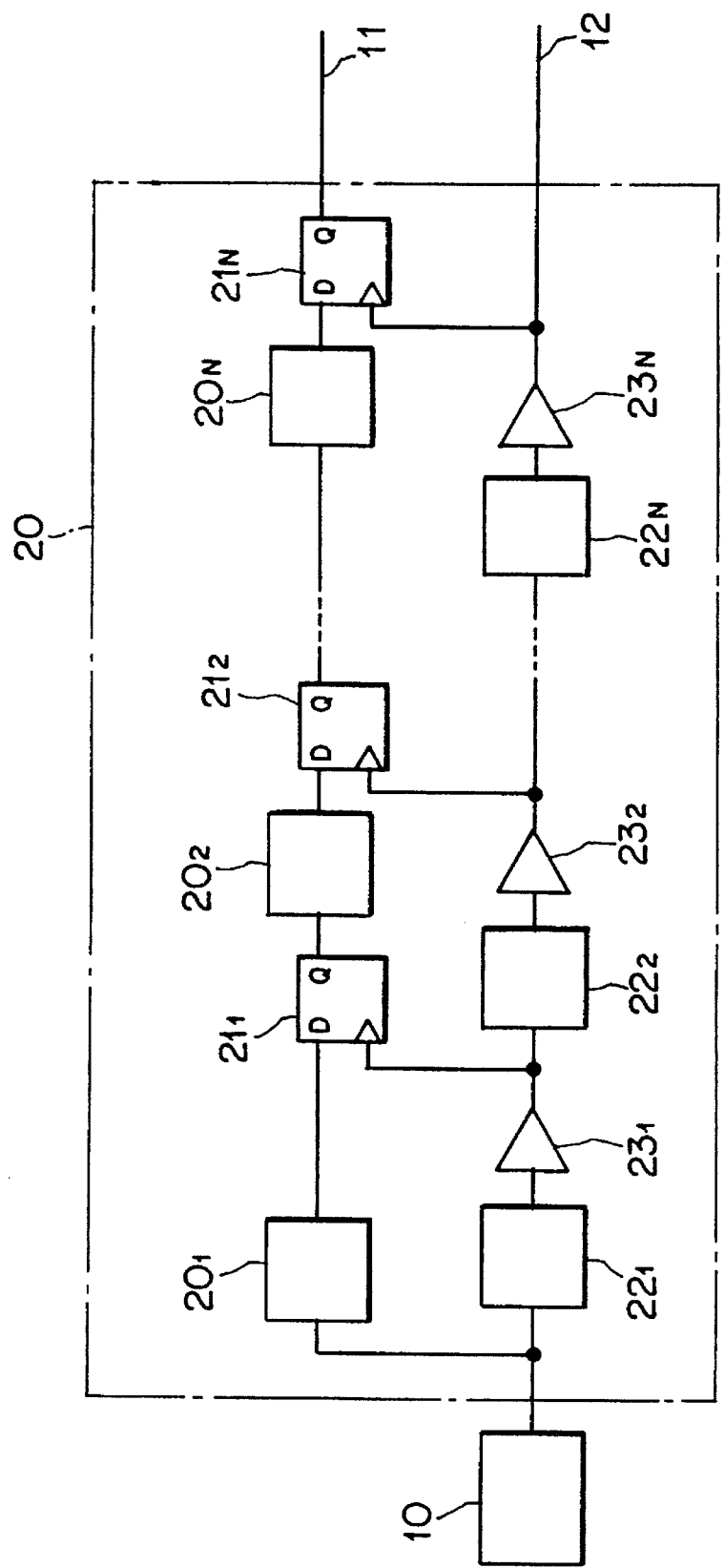
FIG. 4 is a block diagram of a synchronous data row generating circuit of a prior art.
Figure 5:
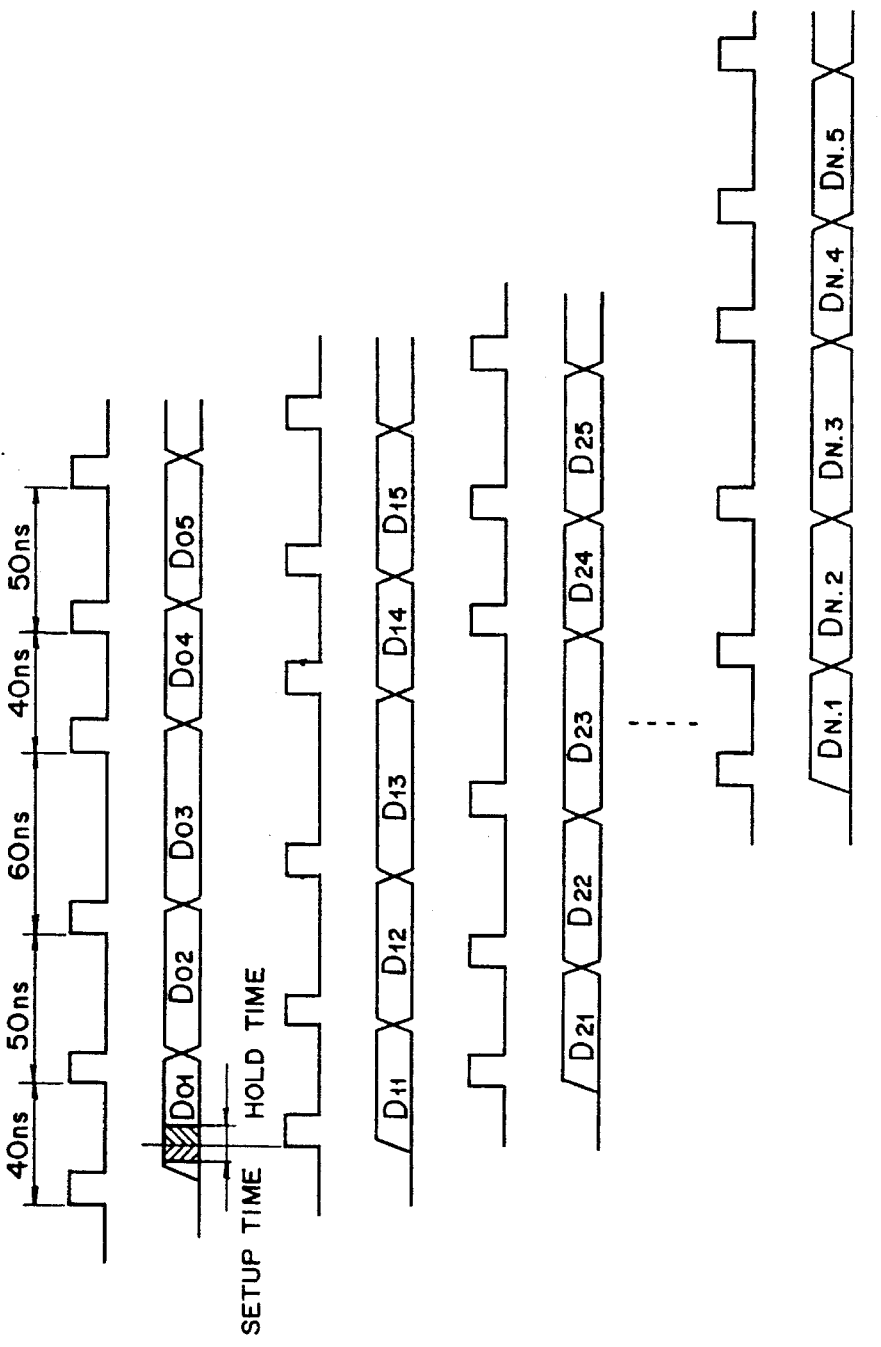
FIGS. 5(a) to 5(h) are waveform diagrams for explaining the operation of the synchronous data row generating circuit in FIG. 4.

FIG. 3 shows an arrangement of the synchronous data row generating circuit according to a modified embodiment of the invention. In FIG. 3, denoted at I is a rate generating portion, $2_1$ to $2_M$ are data row generating portions, $3_1$ to $3_M$ are preceding rate masking circuits and $4_1$ to $4_M$ are D-type FFs.

The modified embodiment illustrated in FIG. 3 is a case wherein the data row generating portion 2 according to the embodiment in FIG. 1 is substituted by M data row generating portions $2_1$ to $2_M$ so as to perform the same operation as the case in FIG. 1 by masking the preceding rate signals in the preceding rate masking circuits $3_1$ to $3_M$ by the shifting amounts of the data row generating portions $2_1$ to $2_M$ respectively.

According to the present invention, in order to generate a data row which synchronizes with a rate signal having arbitrary time intervals for use in an IC tester etc., the rate generating portion generates a preceding rate signal and thereafter generates a desired rate signal to supply them to a data row generating portion, which generates a data in synchronism with the rate signal generated by the rate generating portion and outputs the data of which the preceding rate signal alone is masked by a preceding rate masking circuit, so that it is possible to stably generate a data row having desired time intervals without using delay elements for adjusting the setup time or hold time of D-type FFs etc.

What is claimed is:

1. A synchronous data row generating circuit comprising:

a rate generating portion which generates a rate signal comprising a desired first rate signal component having arbitrary time intervals preceded by a preceding rate signal component composed of (N+1) pulses:

a data row generating portion composed of N logic circuits and N D-type flip-flops for generating an arbitrary data row with said rate signal as a synchronizing signal;

a preceding rate masking circuit which masks said preceding rate signal component in said rate signal to output said first rate signal component; and a D-type flip-flop which receives said output of said data row generating portion at a data input terminal thereof and said output of said preceding rate masking circuit at a clock input terminal thereof so as to generate a first data row in synchronization with said first rate signal.

2. A synchronous data row generating assembly comprising:

a rate generating portion for generating a first rate signal;

M (M is a natural number) data row generating circuits;

M preceding rate masking circuits; and

M D-type flip flops for generating a first data row in synchronism with said first rate signal; wherein said rate generating portion and M sets of data row generating portions, each said data row generation portion set being composed of one of said data row generating circuits, one of said preceding rate masking circuits and one of said D-type flip-flops, are connected to one another in series.

* * * * *